United States Patent [19]

Uekita et al.

[11] Patent Number: 5,071,694

[45] Date of Patent: Dec. 10, 1991

[54] MULTI-LAYER RESIST

[75] Inventors: Masakazu Uekita; Hiroshi Awaji; Satoshi Mizunuma, all of Kobe, Japan

[73] Assignee: Kanegafuchi Kagaku Kogyo Kabushiki Kaisha, Osaka, Japan

[21] Appl. No.: 481,275

[22] Filed: Feb. 20, 1990

[30] Foreign Application Priority Data

| Feb. 21, 1989 | [JP] | Japan | 1-41338 |
| Mar. 17, 1989 | [JP] | Japan | 1-67142 |
| Apr. 4, 1989 | [JP] | Japan | 1-86601 |

[51] Int. Cl.$^5$ ............ B32B 27/00; B32B 27/34; B05D 1/20
[52] U.S. Cl. ............ 428/216; 428/411.1; 428/432; 428/442; 428/473.5; 428/469; 428/329; 428/463; 427/430.1; 427/434.3
[58] Field of Search ............ 428/411.1, 215, 432, 428/329, 442, 473.5, 469, 463, 216

[56] References Cited

U.S. PATENT DOCUMENTS

| 3,312,663 | 4/1967 | Sorenson . | |
| 3,326,851 | 6/1967 | Tocker. | |
| 3,551,383 | 12/1970 | Fang . | |
| 4,022,732 | 5/1977 | Schwartz . | |
| 4,554,076 | 11/1985 | Speaker | 210/639 |
| 4,598,056 | 7/1986 | Barraud et al. | 502/4 |
| 4,740,396 | 4/1988 | Uekita et al. . | |
| 4,801,420 | 1/1989 | Uekita . | |
| 4,822,853 | 4/1989 | Uekita et al. . | |
| 4,839,219 | 6/1989 | Uekita et al. . | |

FOREIGN PATENT DOCUMENTS

| 54-145794 | 11/1979 | Japan . |
| 55-3027 | 8/1980 | Japan . |

OTHER PUBLICATIONS

Engel et al., "Polymeric Materials Science and Engineering"—Proceedings of the ACS Division of Polymeric Materials, 1986.
Vincett et al., Thin Solid Films, 68, 1980, pp. 135-171.
Cemel et al., J. Polym. Sci., Part A-1, vol. 10, 2061-2083 (1972).
Enkelmann et al., J. Poly. Sci.: Poly. Chem. Ed., vol. 15, 1843-1854 (1977).
Barraud et al., J. Colloid Interface Sci., vol. 62, 509-523 (1977).
Lieser et al., Thin Solid Films, vol. 68, 77-90 (1980).
Tredgold et al., Thin Solid Films, vol. 99, 81-85 (1983).
Tredgold et al., J. Phys. D: Appl. Phys., vol. 18, 2483-2487 (1985).
"Method for Preparation of Polyimide Monomolecular Film and Built-Up Film", a Brochure Handed Out at Fine Chemical Exposition, Mar. 11-13, 1986.
"Polyimide Built-Up Film", a Preprint for the Annula Spring Meeting of Japan Chemical Society, Apr. 1, 1986.
Engel et al., J. Am. Chem. Soc., 1985, 107, pp. 8308-8310.
Suzuki et al., Chemistry Letters, 1986, pp. 395-398.
Kakimoto et al., Chemistry Letters, 1986, pp. 823-826.

*Primary Examiner*—P. C. Sluby
*Attorney, Agent, or Firm*—Armstrong, Nikaido, Marmelstein, Kubovcik & Murray

[57] ABSTRACT

A multi-layer resist comprising (A) a layer of a Langmuir-Blodgett film, (B) a layer of at least one thin film and (C) a substrate, said layer (B) being placed between said layer, (A) and said substrate (C). The multi-layer resists of the invention are applicable to ultra fine processing on the order of submicron, half-micron or quarter-micron, and the number of defects can be remarkably decreased.

12 Claims, No Drawings

MULTI-LAYER RESIST

BACKGROUND OF THE INVENTION

The present invention relates to a multi-layer resist which can be used in micro processing, and more particularly to a multi-layer resist wherein one or more thin films are placed between a Langmuir-Blodgett film (hereinafter referred to as "LB film") and a substrate.

The integration of semiconductor has been progressing, so a four megabit chip (4M-chip) goes into quantity production and a 16M-chip or 64M-chip begins to be made on an experimental basis. In order to realize such an integration, it is necessary to form a line of 0.7 μm, 0.5 μm, or 0.3 μm in minimum width.

In view of the above-mentioned problem, EP-A-0308948 or Japanese Unexamined Patent Publication No. 63-191831 (Tokkyo Kokai No. 63-191831) proposes an LB film suitable for use of a single layer resist which is high in resolution and excellent in dry etching resistance.

However, there is a problem that when forming a very thin LB film on an uneven surface of a substrate, great unevenness is formed in the LB film. As the steps of semiconductor processing proceed, the number of defects are increased.

Also, there is a problem that it is difficult to obtain a pattern with excellent resolution due to reflected light or scattered light from a substrate surface.

A conventional three-layer resist comprising a layer of a resist for forming an image, a silicon dioxide layer and a layer of an organic material having a dry etching property was already proposed. In order to obtain resolution of about 0.3 μm, when using such a three-layer resist, it is important to shorten the wavelength of a light source used and to make the thickness of the image-forming resist film thin.

However, in the case of phenol-novolak positive resists which are generally used, it is difficult to obtain excellent patterns because of its strong absorption in the deep ultraviolet region. Also, according to spin coating method, it is difficult to coat thinly and uniformly without defects.

An object of the present invention is to provide a multi-layer resist with substantially no defects.

A further object of the present invention is to provide a micro processing process using such a multilayer resist.

These and other objects of the present invention will become apparent from the description hereinafter.

SUMMARY OF THE INVENTION

It has now been found that in a resist ultilizing an LB film, when one or more layers of thin films are placed between the LB film layer and the substrate to cover sharp edges of the uneven substrate surface or to make the sharp edges even, the number of defects can be decreased.

According to the present invention, there is provided a multi-layer resist comprising (A) a layer of a Langmuir-Blodgett film, (B) a layer of at least one thin film and (C) a substrate, the layer (B) being placed between the layer (A) and the substrate (C).

Also, in accordance with the present invention, there is provided a micro processing process using the multilayer resist as mentioned above.

DETAILED DESCRIPTION

As the LB film, layer (A), used in the present invention, known LB films capable of forming a pattern by high energy rays such as ultraviolet rays, electron beams or X-rays. Preferably, there are used LB films prepared from a high molecular weight compound, which are improved in heat resistance, mechanical strength and chemical resistance, from which a pattern can be formed by ultraviolet rays, electron beams and X-rays, and which are described in EP-A-0308948 and Tokkyo Kokai No. 63-191831. Concretely, there are exemplified, for instance, a photosensitive amphiphilic high polymer comprising a linear recurring unit containing at least a divalent 1st organic group $R^1$ having at least two carbon atoms and at least a divalent 2nd organic group $R^2$ having at least two carbon atoms, the organic groups $R^1$ and $R^2$ being connected to each other by a divalent linkage group formed by the reaction of an acid group A containing a hetero atom and a basic group B containing a hetero atom, at least one hydrocarbon-containing group having 10 to 30 carbon atoms, which may have a substituent, bonded to the recurring unit by a covalent bond or an ionic bond, and a dimerizable or polymerizable unsaturated bond or an orthonitrobenzyl group

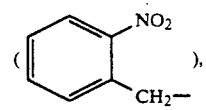

which may have a substituent, contained in a part or the whole of the recurring unit; a polymer having linear recurring units wherein a first organic group $R^1$ having at least 2 carbon atoms and a valence of at least 2 is combined alternately with a second organic group $R^2$ having at least 2 carbon atoms and having a valence of at least 2 through a bivalent group formed by a reaction of an acid group A containing a hetero atom and a basic group B containing a hetero atom, and wherein a hydrocarbon-containing group $R^3$ having 10 to 30 carbon atoms which may contain a substituent group, is linked by covalent bond or ionic bond to the recurring units, the number of groups $R^3$ being at least 2 per 10 recurring units; and the like.

The LB technique which is a preparation method of the LB film used in the present invention is explained.

The LB technique is a method in which a LB material is spread onto the surface of water and compressed at a constant surface pressure to form a monomolecular layer film and the monomolecular layer is transferred onto a substrate. LB films can be formed by any of the so-called LB techniques without restriction, e.g. the vertical dipping method (LB method), the horizontal dipping method, the revolving cylindrical method and so on (as described in Shin Jikken Kagaku Koza, Vol. 18, "Interface and Colloid", pages 498–508).

According to the LB technique, oriented films can be obtained, and moreover the thickness of the films can be controlled to several tens angstroms. Accordingly, the LB technique is advantageous in providing thin films having a thickness of not more than 1000 Å, e.g. several hundreds angstroms or several tens angstroms. Of course, films having a thickness of 10,000 Å or more can be obtained according to the LB technique. The thin films used in the invention have such a feature in thickness.

The polymers as described in EP-A-0308948 and Tokkyo Kokai No. 63-191831 are able to form thin films by the LB technique. The thin film can be formed from the polymer alone. When the proposed polymer in the above publications is used in combination with a known compound capable of forming films by the LB technique (hereinafter referred to as "LB compound"), the film forming properties can be improved. The use of such a mixture as a LB film-forming material is one of the preferable embodiments of the invention. In particular, in the case where the hydrocarbon-containing group having 10 to 30 carbon atoms, which may have a substituent, is introduced in a small amount to the recurring units in the polymer, such a polymer is preferably used in combination with a known LB compound. The term "known LB compound" as used herein means compounds known in the art to form films by the LB technique, and they are described, for instance, in the literatures referred to above. Especially, compounds composed of a hydrocarbon group having about 16 to about 22 carbon atoms and a hydrophilic group are preferred as the LB compound to be admixed with the polymer, e.g. $CH_3(CH_2)_{n-1}Z$, $CH_2=CH(CH_2)_{n-2}Z$, and $CH_3(CH_2)_lC\equiv C-C\equiv C(CH_2)_mZ$ wherein Z is OH, $NH_2$, COOH, $CONH_2$ or COOR' in which R' is a lower aliphatic hydrocarbon group, n is an integer of 16 to 22, and $l+m=n-5$. The compound having the formula: $CH_3(CH_2)_{n-1}Z$ wherein Z and n are as defined above is superior in improving the film forming properties and from the viewpoint of the cost. The compound having unsaturated bonds has a feature that it can be polymerized by irradiating lights or radiation such as ultraviolet rays or electron beams. The mixing ratio of the polymer to the known LB compound is not particularly limited. Usually, the ratio of the polymer to the known LB compound is from 0.2 to 2. Also, the proposed polymer may be used alone or as an admixture thereof.

In general, a solvent such as benzene or chloroform which evaporates into a gas phase without dissolving in water, is used for spreading an LB film forming material onto the water surface. In case of the polymer used in the invention, it is preferable to use such a usual solvent in combination with an organic polar solvent for increasing the solubility. Examples of the organic polar solvent are, for instance, N,N-dimethylformamide, N,N-dimethylacetamide, N,N-diethylformamide, N,N-diethylacetamide, N,N-dimethylmethoxyacetamide, dimethylsulfoxide, N-methyl-2-pyrrolidone, pyridine, dimethylsulfone, hexamethylphosphoramide, tetramethylenesulfone, dimethyltetramethylenesulfone, and the like.

When the mixture of the polymer and the known LB compound is spread onto the water surface, it is also preferable to use a solvent such as benzene or chloroform in combination with an organic polar solvent.

In case of using a solvent such as benzene or chloroform in combination with an organic polar solvent, it is considered that when a solution for forming LB films is spread onto the water surface, benzene, chloroform or the like evaporates into the gas phase and the organic polar solvent dissolves into a large quantity of water.

The thin film layer (B) to be placed between the LB film layer (A) and the substrate (C) is explained below. The layer (B) comprises at least one thin film.

As one preferable embodiment of the invention, there is a case where an inorganic thin film is used as the thin film layer (B).

The use of the inorganic thin film is advantageous because the inorganic thin film, which can be formed from an inorganic material soluble in an organic solvent, covers sharp edges of the uneven substrate surface or makes the sharp edges even. Thin films of aluminum oxide and thin films of silicon dioxide obtained by coating method are preferably used as the inorganic thin film layer (B).

In case of forming the aluminum oxide film, aluminum metal complexes, e.g. disclosed in U.S. Pat. No. 4,040,083, can be used. In such a case, the film thickness can be controlled by altering the kinds of the aluminum metal complex used, the rotating speed of a spin coater upon coating, concentrations of the aluminum metal complex solution, and the like.

Examples of the aluminum metal complex are, for instance, aluminum monoethylacetoacetate diisopropylate, aluminum tris-(ethylacetoacetate), aluminum tris-(acetylacetate), aluminum tris-(ethylmalonate), aluminum diethylacetoacetate monoisopropylate, and the like.

Also, silicon oxide film-forming materials utilized in processing of a wafer of a semiconductor can be used as the material of the inorganic film layer (B). The coating solution used for forming the silicon oxide thin film is a solution wherein an organic silicon compound having the formula: $R_nSi(OH)_{4-n}$ wherein R is an alkyl group and n is 1, 2, 3 or 4 as a main component, a glass forming material, for instance, materials containing at least one element of P, B, Zn, As, Sb, Al and Mg and an organic binder are dissolved in an organic solvent containing an alcohol such as ethanol or methanol as a main component. The desired thin film can be easily obtained by various coating methods.

As an another preferable embodiment of the present invention, there is a case where a layer composed of a film prepared from an inorganic material and a film prepared from an organic polymer material having dry etching resistance is used as the thin film layer (B). The thin film layer (B-1) prepared from the inorganic material is formed between the LB film layer (A) and the substrate (C), and the thin film layer (B-2) prepared from the organic polymer material is formed between the inorganic thin film layer (B-1) and the substrate (C).

The inorganic materials used in this preferable embodiment are explained below.

The pattern of the LB film, the outer layer (A) is transferred on the inorganic film layer (B-1), and then a pattern of the organic polymer film layer (B-2) is obtained according to oxygen reactive ion etching (RIE) by using the thus obtained pattern of the inorganic film layer (B-1) as a mask.

Silicon dioxide, silicon nitride, silicon, germanium, spin-on-glass, and the like are preferably used as the inorganic material. The films of these inorganic materials can be formed by vacuum evaporation method, CVD (chemical vapor deposition) method, and the like.

Also, the silicon oxide film forming materials utilized in processing of the semiconductor wafer as explained above can be preferably used. That is, the solution wherein the organic silicon compound: $R_nSi(OH)_{4-n}$ as the main component, the glass forming material and the organic binder are dissolved in the organic solvent containing the alcohol as the main component is used as the coating solution. The desired film can be easily formed from the coating solution by various coating methods such as spin coating.

The organic polymer material having dry etching resistance, which is formed into the layer (B-2) placed on the substrate (C) and under the inorganic film layer (B-1), is selected from organic polymer materials which can make unevenesses of the substrate surface even and can act as a mask upon dry etching of the substrate.

Examples of the organic material are, for instance, acrylic resins such as polymethyl methacrylate, polyacrylate, polymethyl isopropenyl ketone and polyglycidyl methacrylate; styrene resins such as polystyrene, polymethyl styrene, styrene-maleic anhydride copolymer and polyhydroxystyrene; novolak resins such as phenol-formaldehyde novolak resin and cresol-formaldehyde novolak resin; polyimide resins; and the like. Hardbaked novolak resins and polyimide resins are preferable from the viewpoint of dry etching resistance. Especially, novolak positive photoresists widely used and polyimide resins used for semiconductors, which are hardbaked, are preferably used.

The organic materials as mentioned above can be coated on the substrate (C) by any coating method adapted to general semiconductor preparation processes such as spin coating, selecting a suitable solvent such as N,N-dimethylacetamide, N,N-dimethylformamide, N-methyl-2-pyroridone, toluene, benzene, chloroform, acetone or methyl ethyl ketone. The use of the organic material is advantageous for making the unevenesses of the substrate surface even.

Next, pattern formation is explained.

First, the case where the inorganic film is used as the thin film layer (B) is explained.

The inorganic material solution as mentioned above is coated on the uneven substrate surface by spin coating and the like so as to get a film thickness such that the sharp edges of the uneven substrate surface can be covered with the film thereof, or more. Usually, the thickness is from 0.1 to 0.3 μm. It is preferable that after coating by spin coating, and the like, the coated film is baked at a temperature suitable to the used materials, in order to remove the solvent, and the like from the film. If necessary, the inorganic thin film layer (B) can be a multi-layer film composed of two or more kinds of the inorganic films. The LB film is built up on the thin film layer (B) to form the multi-layer resist. In such a case, there is little mixing the components, which takes place when spin coating is conducted in rapid succession. Then, high energy rays such as ultraviolet rays, electron beams or X rays are used to irradiate the resist, if necessary, though a mask. Particularly, ultraviolet rays are preferable. Also, it is more preferable to use excimer laser lights such as KrF since the obtained pattern can be high in resolution and the exposure time can be shortened.

For instance, after exposure to ultraviolet ray through a mask, the exposed area is dissolved by a developer to give a possitive pattern.

Although the reason why a pattern is formed by the irradiation method is not clear, it is considered that, in the positive type, the polymer is degraded by cleavage of the main chain, and it appears that it concerns the fact that the polymer used in the invention has the maximum absorption at $\lambda_{max}$=about 200 nm to about 250 nm.

There are cases where the use of a sensitizer, as disclosed in J. Kosar, Light Sensitive Systems (John Wiley & Sons, Inc., New York, 1965, pages 143-146 and 160-188), is preferred, e.g. Michler's ketone, benzoyl ether, 2-t-butyl-9,10-anthraquinone, 1,2-benzo-9,10-anthraquinone, and 4,4'-bis(diethylamino)benzophenone.

As the developer used in the development of patternwise exposed films, there are used mixed solvents of an organic polar solvent such as dimethylacetamide, dimethylformamide, dimethylsulfoxide, hexamethylformamide or N-methyl-2-pyrrolidone, and an alcohol such as methanol or ethanol. Aqueous ammonia, an aqueous solution of an inorganic alkali and an organic alkaline solution such as tetramethylammonium hydroxide are also suitably used as well as the alcohol.

Also, it is considered that, in the negative type, there occurs a difference in solubility to a solvent between the polymerized or dimerized portion and non-polymerized or non-dimerized portion, whereby a pattern can be formed.

The use of the following sensitizers, or their substituted product with a long chain-hydrocarbon, is preferable. As the preferable sensitizer, there can be used known sensitizers in the art such as anthraquinone, benzoquinone, naphthoquinone, benzanthraquinone and benzophenone. Further, their substituted products with a long chain-hydrocarbon which are modified so as to advantageously act for the LB film are preferably used.

In the negative type, any solvent of the used negatively sensitive compound can be used as the developer. There are preferably used mixed solvents of an organic polar solvent such as N,N-dimethylacetoamide, N,N-dimethylformamide, N,N-diethylformamide, hexamethylphosphamide or N-methyl-2-pyrrolidone and benzene, ethers, chloroform or acetone.

The multi-layer resist pattern can be formed by using the pattern of the LB film as formed above. Particularly when using the pattern of the LB film disclosed in EP-A-0308948 and Tokkyo Kokai No. 63-191831 which are preferable embodiments of the present invention, the thin film which is used for covering the sharp edges of the uneven substrate surface can be removed, because of the excellent dry etching resistance of the LB film, to give the multi-layer resist pattern which is very fine.

Further, many materials such as Si, poly-Si, $Si_3N_4$ and Al can be processed by altering reaction gases such as $CF_4$, $CF_4+O_2$, $CF_4+H_2$, $C_3H_8$, $CCl_4$ and $BCl_3$ according to known dry etching techniques through the mask of the obtained multi-layer resist.

Next, the case where the inorganic film layer (B-1) and the organic polymer layer (B-2) are formed as the thin film layer (B) is explained below.

First, the organic polymer material as explained above is coated on the substrate (C). When the surface of the substrate is uneven, the coated film has a thickness enough to make the uneven surface even and to allow processing of the substrate by dry etching through the pattern of the organic polymer film. Usually, the thickness is from about 1 to 2 μm.

It is preferable that after coating the organic polymer material on the substrate (C) by spin coating, etc., the solvent is removed from the coated film and the film is thoroughly baked for obtaining excellent heat resistance and dry etching resistance.

On the formed organic polymer film layer (B-2) was coated the inorganic material as explained above. The thickness of the inorganic film should be enough to conduct oxygen RIE of the organic polymer film layer (B-2) which is positioned under the inorganic film layer (B-1). Usually, the thickness of the inorganic film is from about 0.1 to 0.3 μm. The multi-layer (three-layer)

resist can be obtained by building up the LB film on the composite thin film layer (B) composed of the organic polymer film layer (B-2) and the inorganic film layer (B-1).

Pattern formation is conducted in the same manner as in the case where the inorganic film is used as the thin film layer (B).

Since the pattern of the LB film is excellent in dry etching resistance, the pattern of the LB film can be transfered to the inorganic film layer (B-1) by anisotropic dry etching. By using the obtained pattern of the inorganic film layer (B-1) as a mask, the pattern of the organic polymer film layer (B-2) can be obtained by oxygen RIE through the mask. By using the obtained pattern of the organic polymer film layer (B-2) as a mask, many materials such as Si, poly-Si, Al and Mo can be finely processed with reaction gases such as $CCl_4$, $CCl_4+He$, $Cl_2$, $CCl_4+O_2$, $BCl_3$ and $SF_6$ according to anisotropic dry etching.

The substrates (C) used in the present invention are not particularly limited, and are selected according to the uses of the formed LB film and thin film. Examples of the substrate are, for instance, an inorganic substrate such as glass, alumina or quartz, a metal substrate, a plastic substrate, a substrate of a semiconductor of Groups IV, III-V, II-VI of the Periodic Table such as Si, GaAs or ZnS, a substrate of a ferroelectric substance such as $PbTiO_3$, $BaTiO_3$, $LiNbO_3$ or $LiTaO_3$, a substrate of a magnetic substance, and the like.

The multi-layer resists of the present invention are applicable to resists for ultra fine processing on the order of submicron, half-micron or quater-micron. The number of the defects can be decreased by using the multi-layer resist of the present invention.

The present invention is more specifically described and explained by means of the following Examples. It is to be understood that the present invention is not limited to the Examples.

EXAMPLE 1 AND COMPARATIVE EXAMPLE 1

A silicon wafer (diameter: 10 cm) on which 1 μm line and space (depth: 0.5μ) stripes were formed was coated with spin-on-glass (coat diffusion-source for semiconductor) commerically available under the trade mark "OCD" from Tokyo Oka Kogyo Kabushiki Kaisha in a thickness of 0.3 μm by spin coating and it was baked at 300° C. for 30 minutes. Then a built-up film of 31 layers was formed on the coated silicon wafer by using a solution of polyamic acid having recurring units of the formula:

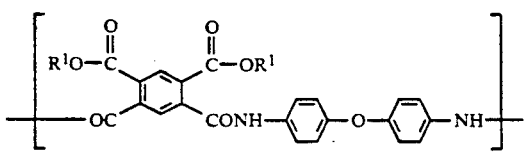

wherein $R^1$ is $CH_3(CH_2)_{17}$ and stearyl alcohol (1:1 by mole) dissolved in a mixed solvent of chloroform and dimethyl acetamide (8:2 by volume) according to the LB technique. The built-up film was exposed to a light having a main wavelength of 250 nm through a mask for 30 minutes and it was developed with an aqueous alkaline solution (an aqueous tetramethylammonium hydroxide) to form a positive pattern of the LB film.

The procedure as above was repeated except that the silicon dioxide film was not formed to give a positive pattern of LB film (Comparative Example 1).

The number of defects of the positive pattern of Example 1 was approximately one-fifth the number of defects of the positive pattern of Comparative Example 1.

Further, by using the obtained positive pattern of the LB film of Example 1 as a mask, the silicon oxide layer, and then the silicon wafer could be subjected to dry etching.

EXAMPLE 2

On a silicon wafer was formed a film of a positive photoresist for semiconductor (novolak resin) commercially available under the trade mark "OFPR 5000" from Tokyo Oka Kogyo Kabushiki Kaisha in a thickness of 1.5 μm and it was baked at 130° C. for 30 minutes, on which a film of OCD (spin-on-glass) was formed in a thickness of 0.2 μm, and it was baked at 130° C. for 30 minutes. A built-up film of 31 layers (810 Å) was formed by using the same solution as used in Example 1 according to LB technique. The built-up film was exposed to a light having a main wavelength of 250 nm through a mask for 30 minutes and it was developed with the same alkaline aqueous solution as used in Example 1 to give a positive pattern of the LB film.

By using the obtained positive pattern as a mask, the spin-on-glass was anisotropically etched with a $CF_4/H_2$ mixed gas and then the novolak resist was subjected to $O_2$ RIE by using the etched spin-on-glass as a mask. As a result, it was confirmed that the positive pattern of the LB film can be preferably transferred.

In addition to the ingredients used in the Examples, other ingredients can be used in the Examples as set forth in the specification to obtain substantially the same results.

What we claim is:

1. A multilayer resist comprising an uneven substrate layer (C); an intermediate layer (B), comprising at least one inorganic thin film, which is at least as thick as the greatest unevenness of said substrate, disposed on said substrate; and a Langmuir-Blodgett film layer (A) disposed on said intermediate layer remote from said substrate which has an uncovered surface which is sufficiently smoother than the surface of said substrate to at least reduce the number of defects therein as compared to an otherwise identical film which does not have said intermediate layer (B).

2. The resist of claim 1, wherein said thin film is prepared from an inorganic material soluble in an organic solvent.

3. The resist of claim 1, wherein said thin film is a two-layer film of a layer of a film prepared from an inorganic material and a layer of a film prepared from an organic polymer material having dry etching resistance.

4. A resist as claimed in claim 1 wherein said intermediate layer (B) comprises an organic polymer thin film second layer (B-2), which is resistant to dry etching, and is disposed on an uneven surface of said substrate, and an inorganic thin film first layer (B-1) disposed on said second layer (B-2) and proximate to said L-B layer (A).

5. A resist as claimed in claim 1 wherein said thin film is about 0.1 to 0.3 microns in thickness.

6. A resist as claimed in claim 4 wherein said inorganic thin film first layer is about 0.1 to 0.3 microns thick, and said organic thin film second layer is about 1 to 2 microns thick.

7. A resist as claimed in claim 4 wherein said inorganic thin film first layer comprises at least one member selected from the group consisting of aluminum oxide and silicon dioxide.

8. A resist as claimed in claim 4 wherein said organic thin film second layer comprises at least one member selected from the group consisting of polymethyl methacrylate, polyacrylate, polymethyl isopropenyl ketone, polyglycidyl methacrylate, polystyrene, polymethyl styrene, styrene-maleic anhydride copolymer, polyhydroxy styrene, phenol formaldehyde resin, cresol formaldehyde resin and polyimide resin.

9. A resist as claimed in claim 1 wherein said substrate is at least one member selected from glass, alumina, quartz, silicon, gallium arsenide, zinc sulfide, lead titanate, barium titanate, lithium niobate and lithium tantalate.

10. In a process for producing a multi-layer composite resist comprising applying a Langmuir-Blodgett film (A) on an uneven substrate (C), the improvement, whereby substantially reducing the number of defect sites in the surface of said composite resist which comprises: applying an intermediate layer inorganic film, of a thickness at least as great as the height of the unevenness of said substrate, to said substrate; then applying said Langmuir-Blodgett film to the surface of said intermediate layer remote from said substrate to produce an uncovered surface on said Langmuir-Blodgett film which is substantially smoother than it would have been without the interposition of said intermediate layer; and the recovering a composite resist having reduced defects.

11. The process as claimed in claim 10 wherein said intermediate film is 0.1 to 0.3 micron in thickness.

12. The process as claimed in claim 10 wherein said intermediate film is at least one member selected from aluminum oxide and silicon dioxide.

* * * * *